May 23, 1967 H. H. WIEDER ETAL 3,321,384

PROCESS FOR PRODUCING SEMICONDUCTOR-FILM HALL DEVICES ON OXIDE-METAL SUBSTRATE

Filed Oct. 27, 1964 2 Sheets-Sheet 1

HARRY H. WIEDER
ARTHUR R. CLAWSON
INVENTORS

BY J. M. St. Amand
ATTORNEY

May 23, 1967 H. H. WIEDER ETAL 3,321,384

PROCESS FOR PRODUCING SEMICONDUCTOR-FILM HALL DEVICES ON OXIDE-METAL SUBSTRATE

Filed Oct. 27, 1964

2 Sheets-Sheet 2

HARRY H. WIEDER
ARTHUR R. CLAWSON
INVENTORS

BY J. M. St. Amand

ATTORNEY 3,321,384

PROCESS FOR PRODUCING SEMICONDUCTOR-FILM HALL DEVICES ON OXIDE-METAL SUBSTRATE

Harry H. Wieder and Arthur R. Clawson, Riverside, Calif., assignors to the United States of America as represented by the Secretary of the Navy Filed Oct. 27, 1964, Ser. No. 406,943
7 Claims. (Cl. 204—38)

ABSTRACT OF THE DISCLOSURE

A process for making semiconductor composite thin films by vacuum deposition of indium antimonide or arsenide on a metal base having an oxide coating which forms a dielectric layer between the metal base and the thin film, with a thin indium layer vacuum deposited over the antimonide or arsenide, and recrystallization of the composite film.

The invention herein described may be manufactured and used by or for the Government of the United States of America for governmental purposes without the payment of any royalties thereon or therefor.

The present invention relates to thin film Hall generators, and more particularly to the fabrication of such generators and the preparation of thin semiconductor films by vacuum deposition of indium antimonide or indium arsenide on a metal base of aluminum or tantalum having an oxide coating thereon. The oxide coating on the metal base forms a dielectric insulating layer between the metal conductor and the thin film.

It is an object of the invention to provide a process for preparing thin film Hall generators on oxide-metal substrates.

Another object of the invention is to provide a method for preparing thin semiconductor films on a metal substrate.

A further object of the invention is to provide improved semiconductor thin films on metal substrates and having greater strength and flexibility than heretofore.

Other objects and many of the attendant advantages of this invention will become readily appreciated as the same becomes better understood by reference to the following detailed description when considered in connection with the accompanying drawings wherein:

FIG. 1 illustrates a typical thin film Hall generator deposited on an oxide-metal substrate.

FIGS. 2*a* and 2*b* are X-ray diffraction patterns of InSb films deposited on and recrystallized on substrate sof anodized aluminum and anodized tantalum respectively.

Figures 2A, 2B:
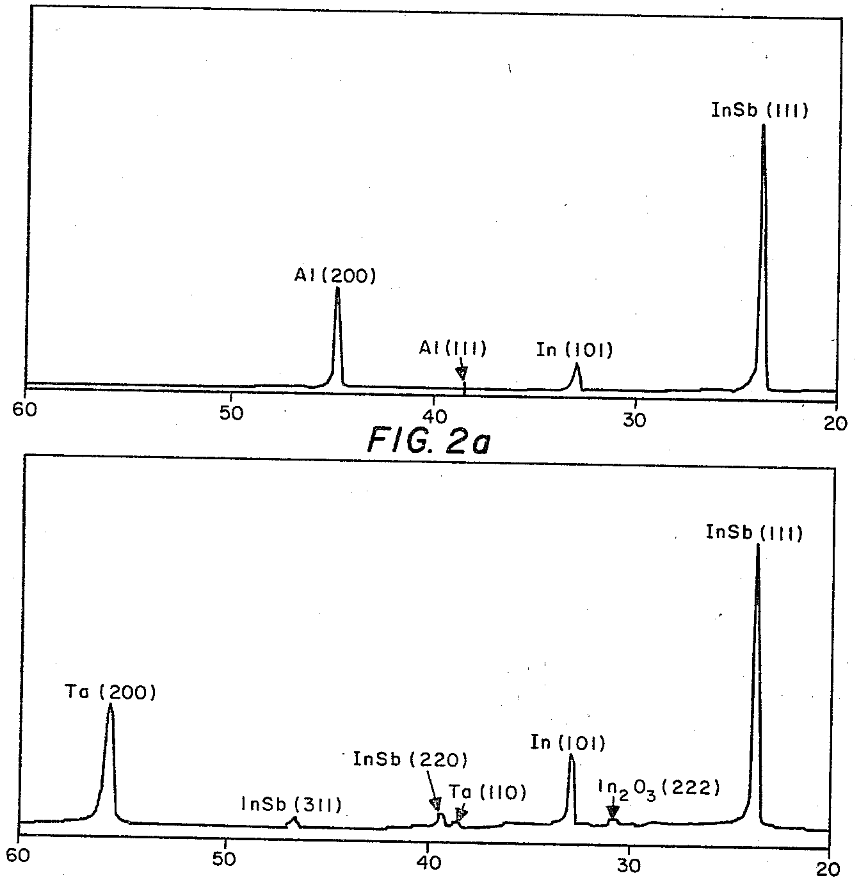

The open circuit Hall voltage output of a Hall generator is expressed by:

$$v_h = R_h \frac{B\times i}{d} \times 10^{-8} \text{ volts} \quad (1)$$

where $R_h$ in cm.$^3$/coulomb is material parameter of the film, B is the effective magnetic induction in gauss acting upon the Hall generator whose thickness is *d*. The transverse Hall voltage $v_h$ is generated in the Hall plate which has a longitudinal current *i* flowing through it. For a fixed $R_h$ and *d*, the sensitivity of a Hall generator $(\partial v_h/\partial i)_{B=\text{constant}}$ is a function of the peak permissible current that may be applied to it without raising its temperature because of joule heating. Such a temperature rise decreases $R_h$ and destroys the linearity between $v_h$ and *i* implied in Equation 1. The peak permissible current may be increased by increasing the heat dissipation of the film by heat radiation, convection or thermal conduction. The most significant of these heat dissipation mechanisms is that of thermal conduction from the film to a heat sink.

Thin film Hall generators have been fabricated primarily by vacuum deposition of indium antimonide or indium arsenide on amorphous glassy substrates. The thermal conductivity of glasses is quite low, and the mechanical strength of glass is also quite low. Metal substrates are desirable because of their high thermal conductivity and mechanical strength. However, metal substrates have not been used in the past since they would short out semiconductor films deposited upon them. The instant invention provides thin film semiconductors on metal substrates by providing a dielectric insulating layer interposed between the film and the metal. If the dielectric layer is made quite thin ($5\times10^2$ to $10^3$ A.) and if it has a high thermal conductivity and a high dielectric breakdown coefficient as well as a three-dimensional thermal expansion coefficient well matched to that of InSb or InAs or other selected semiconductor films, then optimum conditions for heat dissipation might be realized.

Under such conditions, the joule heat transferred from the semi-conductor film to the metal (and an essentially infinite heat sink) may be considered to be a one-dimensional flow of heat and the Hall current *i*, of Equation 1 is:

$$i = [k_e/d_e)\ (A/R)\ (T - T_s)]^{1/2} \quad (2)$$

where $k_e$ and $d_e$ are the thermal conductivity and thickness of the dielectric layer, *A* is the area of the Hall plate, R is the resistance between its drive current electrodes and $T_s$ is the temperature of the heat sink. The effective temperature T of the semiconductor film is thus a function of the variables in Equation 2 and this temperature defines the peak permissible drive curretn *i*, without introducing an $R_h(i)$ as discussed earlier.

A thick metallic oxide layer such as formed for example upon aluminum by anodizing a thin aluminum foil (by means of well-known techniques) would satisfy the requirements of high thermal conductivity, matched thermal expansion characteristics to InSb, adequate mechanical support and minimum overall thickness for a film substrate combination.

Corundum, $Al_2O_3$ layers between $10^2$ A. to $10^3$ A. in thickness were fabricated on $2.54\times10^{-3}$ cm. thick aluminum foil. It was important to learn whether these layers could withstand a prolonged exposure to temperatures of the order of 400° C. without the introduction of microcracks which might cause an electrical breakdown between the semiconductor film vapor deposited and recrystallized on its surface and the Al metal below the insulating layer. It was also necessary to determine experimentally if, during the process of film deposition and recrystallization, any chemical reaction might take place between the $Al_2O_3$ layer and the InSb film. Such a reaction might introduce impurity atoms into the semiconductor and reduce the mobility of charge carriers and/or their optimum concentration density, and could, therefore, affect the sensitivity and performance of Hall generators by decreasing sharply the effective value of $R_h$ in Equation 1.

Figure 1:
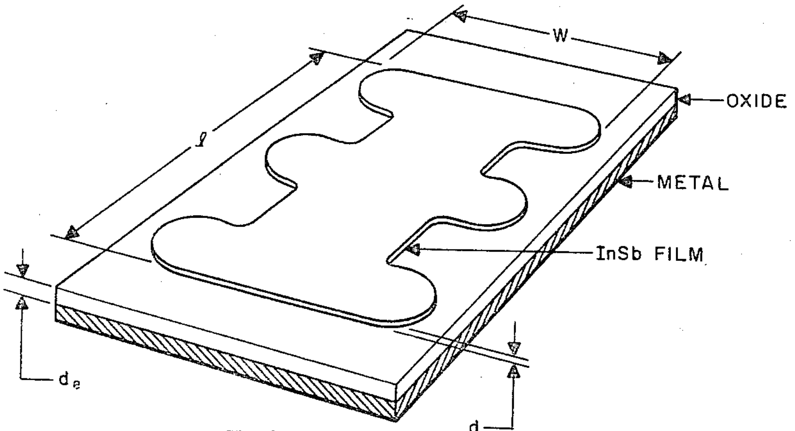

The following presents experimental data and describes in detail the results obtained with Hall generators fabricated from InSb films deposited through a mask on an intermediate $Al_2O_3$ substrate oxidized upon an aluminum foil base:

FIG. 1 shows a Hall generator fabricated according to the instant invention. The usual contour for a Hall plate is shown; length=$l$, width=$w$ and thickness=$d$. The oxide substrate is of thickness $d_e$ on a metal backing. A metal base 10 of aluminum foil $2.54\times10^{-3}$ cm. thick was first oxidized and the corundum film 12 formed on its surface was estimated to be of the order of $8\times10^2$ A. An indium antimonide film 14 was then vacuum deposited upon this substrate through a mask and then coated with indium. Films formed in this manner were then heated in vacuum and recrystallized according to the procedure described in copending U.S. patent application Ser. No. 385,523 filed July 27, 1964. Such a fabricated Hall generator has electrical properties that have been found to be excellent and entirely stable.

FIG. 2*a* shows the Debye-Sherrer X-ray diffraction pattern of such an InSb film grown upon and recrystallized on an $Al_2O_3$ intermediate dielectric substrate and an aluminum base. The behavior is quite similar to that of films recrystallized on Pyrex and glass. Recrystallization brings about a preferential ordering in the film, the 111 plane is shown to be parallel to the substrate, the rest of the InSb spectrum is missing. A slight indium 101 peak is present and also, of course, the characteristic aluminum 111 and 200 planes. The high current sensitivity, $(\partial v_h/\partial i_h)_{B=\text{constant}}$ is evident from FIG. 3. The nominal Hall voltage and the nominal Hall current are considerably larger than in films of identical contour and thickness deposited on glass or Pyrex substrates.

By recrystallization as used in the instant and copending applications, is meant a process whereby the vacuum deposited semiconductor layer undergoes a phase transformation from a solid to a liquid and back to a solid.

Figure 3:
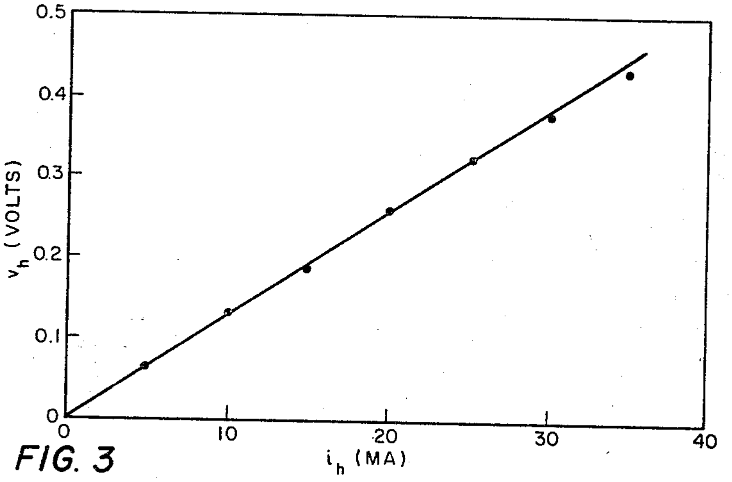
FIG. 3 shows Hall voltage as a function of drive current in the presence of a fixed field of $5\times10^3$ gauss for a vacuum deposited and recrystallized film of InSb on an $Al_2O_3$–Al substrate. The film thickness is of the order of $1\mu$.

A comparison with prior data shows that the nominal Hall current for the film on glass is 6 ma. while from FIG. 3 films of the present invention are of the order of 28 ma. The improvement in heat transfer between the InSb films and the aluminum substrate through the very thin and thermally conductive corundum layer is primarily responsible for the increase in the linearity shown in FIG. 3. This linearity was not obtained at a sacrifice in electron mobility since the measured virtual mobility is $8.8\times10^3$ cm.$^2$/(volt-sec.). The high magnetoresistance coefficient at room temperature $(\Delta R/R)=80\%$ at $5\times10^3$ gauss and the low resistance between the current electrodes at zero magnetic field $R_{H=0}=60$ ohms, indicate that the film is composed of relatively few crystallites of large size and the intergrain barriers do not play a significant role.

While some difficulties were anticipated with InSb films on $Al_2O_3$-Al substrates because of possible electron tunneling effects through the dielectric or possibly conductive sneak path in pin-holes in the oxide layer, which might shortcircuit portions of the InSb film, no such effects were found in the films for $i_h\leq10$ ma. However, films which have an apparent D.C. path from the InSb through the aluminum, yield a Hall voltage which is unimpaired by this effect. For higher currents, there is some instability due to apparent avalanche conduction in the insulating oxide layer. One film on aluminum was driven with currents up to 40 ma. (with a voltage drop across the sample of 3.4 volts at 5 kg.). At this current, the output decreased suddenly by 30% and drifted erratically. Upon reducing the current to 10 ma., the Hall voltage and film resistance returned to their original value and there was no further sign of instability. High current of the order of 40 ma. also cause a sharp increase in joule heat of the order of 0.136 watt. This undoubtedly contributes to the breakdown of the dielectric layer. The conduction mechanism might also depend either upon Schottky high field emission, tunneling, or both of these phenomena might contribute to the observed effect. In any case, under normal conditions, i.e., for currents $i_h\leq30$ ma., these phenomena may be ignored since the advantages of $Al_2O_3$ substrates on Al metals outweigh the disadvantages in the fabrication of Hall generators having a wide dynamic $i_h$ range.

Figure 4:
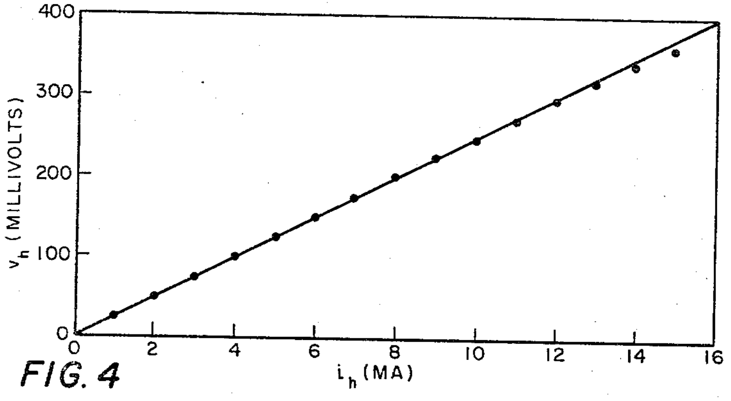
FIG. 4 shows Hall voltage vs. Hall current in the presence of a fixed magnetic field of $5\times10^3$ gauss for an InSb film vacuum deposited and recrystallized on anodized tantalum.

Also another metal oxide-metal substrate was investigated. Sheets $2.54\times10^{-3}$ cm. of anodized tantalum are available commercially. They are used primarily for the fabrication of electrolytic capacitors. The oxide $Ta_2O_5$ formed on the surface of the Ta sheet has a high dielectric constant and a high dielectric breakdown coefficient. Results similar to those obtained with Al-$Al_2O_3$ substrate were obtained with this material. A Hall generator was fabricated on a Ta-$Ta_2O_5$ substrate; the dependence of the Hall voltage upon drive current is shown in FIG. 4. FIG. 2*b* shows the Debye-Sherrer X-ray pattern of an InSb film evaporated upon it; the ordering effect is not as pronounced as that obtained with corundum substrates. The InSb planes 220 and 311 are in evidence. In addition, the free indium 101 plane and the formation of an $In_2O_3$ peak 222 are in evidence.

The Debye-Sherrer X-ray patterns of FIG. 2*a* show that no chemical reaction occurs during the deposition or the subsequent recrystallization of the InSb films since all the peaks are accounted for in terms of the film or the substrate. These X-ray patterns also show that no dominant epitaxial effects are present since ordering of crystallites along the 111 crystalographic direction parallel to the substrate occurs in these films just as in films processed on glass substrates.

The electron mobility of the InSb films is high, of the order of $8.8\times10^3$ cm.$^2$/volt-sec. This compares well with best films deposited on glass or Pyrex which, at best reach a mobility of $12\times10^3$ cm.$^2$/volt-sec.

Also, the effective current $i_n$ at which joule heating is noticeable by a departure from linearity in the plot, FIG. 3, of $v_h$ vs. $i$, Equation 1 is almost five times greater for films deposited on the $Al_2O_3$-Al substrate compared to similar films deposited on glass. Thus, the magnetic field sensitivity $(\partial v_h/\partial B)_{i=i_n}$ is also five times larger for the format as compared to the latter substrates in accordance with Equation 2. This illustrates the improvement in thermal heat transfer from the films because of the higher thermal conductance of the $Al_2O_3$ layer.

The galvanomagnetic properties of the InSb films on $Al_2O_3$-Al substrates are unaffected by normal mechanical handling, involving some flexing, bending in a slight radius of curvature or other processing involved in the attachment of temporary or permanent leads to the current drive and Hall electrodes. Complex mechanical shapes can be assumed by such Hall plates in contrast to similar Hall generators on ceramic or glass substrates which are brittle, inflexible and much more subject to damage under mechanical loading or severe mechanical shock excitation.

It is not practical to deposit InSb films on glass substrates thinner than 0.005 inch because of severe nonplanar stresses developed in the glass during deposition and because of extreme fragility during subsequent handling. Since InSb films deposited $Al_2O_3$-Al substrates are essentially 0.001 inch thick, this brings about a considerable reduction in the magnetic reluctance of a gapped magnetic circuit in which such Hall generators are placed.

The reluctance may be linearly proportional to the gap:

$$R=\frac{(L/\mu)+l}{A} \qquad (3)$$

where $l$=gap spacing, $R$=reluctance, $L$=length of magnetic path of cross-sectional area A and permeability $\mu\phi$.

Figure 6:
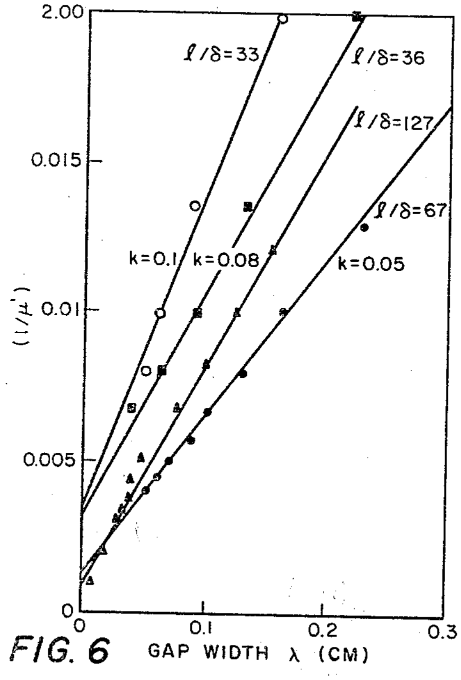
FIG. 6 are curves showing that flux concentrators increase the external field acting upon a Hall generator placed in the air gap between them.
Figure 5:
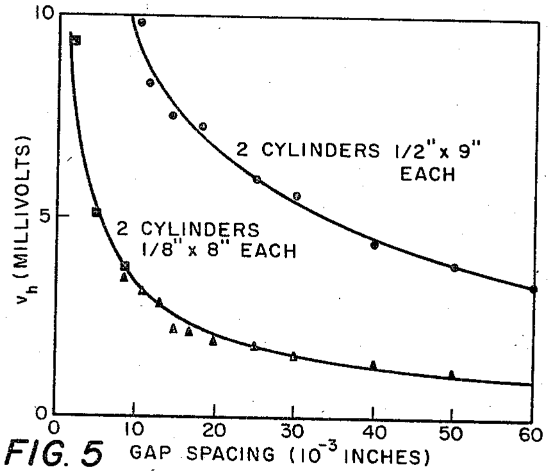
FIG. 5 shows Hall voltage as a function of gap spacing between $\mu$-metal flux concentrators for InSb film Hall generators evaporated and recrystallized on glass substrates.

For cylindrical flux concentrators of $\mu$-metal or other high permeability materials used to increase the effective field between them, the gap width is of much greater significance as shown by FIGS. 5 and 6.

FIG. 5 shows Hall voltage as a function of gap spacing between $\mu$-metal flux concentrators for InSb film Hall generators evaporated and recrystallized on glass. Two different sets of flux concentrators were used and the measurements were performed by aligning the assembly parallel to the horizontal component of the earth's magnetic field.

FIG. 6 shows that flux concentrators increase the external field acting upon a Hall generator placed in the air gap between them. The ratio of the field in this gap $B_g$ to the ambient magnetic field $H_a$ is $\mu'=(B_g/H_a)$. The reciprocal, $(1/\mu')$ is shown to be a linear function of gap width $\lambda$. The slope $k$ is a function of the length to diameter ration $(l/\delta)$ of the flux concentrators. For $(l/\delta=$ 127 the flux concentrators were not homogeneous in thickness. The cylinders were ⅛ inch in diameter except for a 1-inch long section in the vicinity of the air gap which was ¼" in diameter and each cylinder was 8" long.

A considerable flux multiplication can be realized by using $Al_2O_3$ on Al rather than glass substrates. Since metal films even thinner than 0.001 inch can be fabricated with relative ease, there is a possibility of a further decrease in the effective gap width of magnetic circuits employing such Hall generators.

The oxide-metal type substrate has the additional advantage of providing a most effective radio frequency bypass capacitance between the semiconductor films and the metal base. This is particularly important if the Hall generator must be kept above ground and yet radio frequency induced currents are to be kept out of the Hall circuit. If the metal base is connected to ground, both periodic and aperiodic high frequency signals can be eliminated.

Another oxide-metal substrate, $Ta_2O_5$-Ta yields similar results to those obtained with $Al_2O_3$-Al substrates. It may, therefore, be desirable to choose oxide-metal substrates which provide the best match for patricular semiconductor films of other III–V compounds or possibly for elemental semiconductors. $TiO_2$ (titanium dioxide) and other refractory metals having an oxide layer, 100–200 A. thick formed chemically, thermally or in combination thereon are also suitable.

Obviously many modifications and variations of the present invention are possible in the light of the above teachings. It is therefore to be understood that within the scope of the appended claims the invention may be practiced otherwise than as specifically described.

What is claimed is:

1. The process of fabricating improved semiconductor devices for Hall generators, and magneto-resistive devices, comprising:
   (a) anodizing a refractory metal substrate to form an insulating surface which has a thermal expansion compatible with a semiconductor film to be deposited thereon,
   (b) vacuum depositing a film selected from the group consisting of InSb and InAs onto the insulating anodized surface of said metal substrate,
   (c) overcoating said semiconductor film in a vacuum with a layer of indium of from 100 A. to 200 A. thickness,
   (d) radiant heating the composite film to cause recrystallization thereof of said film into large crystal grains and fusing of the semiconductor film to the anodized surface without chemical interaction between the anodized surface and the film.

2. A process as in claim 1 wherein said refractory metal substrate is aluminum.

3. A process as in claim 1 wherein said insulating anodized surface is $Al_2O_3$.

4. A process as in claim 1 wherein said refractory metal substrate is tantalum.

5. A process as in claim 1 wherein said insulating anodized surface is $Ta_2O_5$.

6. A process as in claim 1 wherein said refractory metal substrate is of the order of $2.54\times10^{-3}$ centimeters in thickness.

7. A process as in claim 1 wherein said insulating anodized surface is $TiO_2$.

References Cited by the Examiner

UNITED STATES PATENTS

| | | | |
|---|---|---|---|
| 1,900,018 | 3/1933 | Lilienfeld | 317—231 X |
| 3,041,508 | 6/1962 | Henkel et al. | 317—235.23 |
| 3,165,672 | 1/1965 | Gillert | 174—68.5 |
| 3,260,980 | 7/1966 | Weiss | 317—235.23 |

FOREIGN PATENTS

| | | |
|---|---|---|
| 3,260,980 | 7/1966 | Germany. |

JAMES D. KALLAM, *Primary Examiner.*